(12) United States Patent
Duong et al.

(10) Patent No.: US 10,215,389 B2
(45) Date of Patent: Feb. 26, 2019

(54) SYSTEMS AND METHODS FOR A SMART MODULE DIRECTLY EMBEDDED ON A LIGHTING FIXTURE

(71) Applicant: Fluence Bioengineering, Austin, TX (US)

(72) Inventors: Dung Duong, Austin, TX (US); Randy Johnson, Austin, TX (US); Nick Klase, Austin, TX (US)

(73) Assignee: Fluence Bioengineering, Inc., Austin, TX (US)

( * ) Notice: Subject to any disclaimer, the term of this patent is extended or adjusted under 35 U.S.C. 154(b) by 0 days.

(21) Appl. No.: 15/859,409

(22) Filed: Dec. 30, 2017

(65) Prior Publication Data

US 2018/0356083 A1 Dec. 13, 2018

Related U.S. Application Data

(60) Provisional application No. 62/516,412, filed on Jun. 7, 2017.

(51) Int. Cl.
| | | |
|---|---|---|
| *H05B 33/08* | (2006.01) | |
| *H05B 37/02* | (2006.01) | |
| *F21V 23/00* | (2015.01) | |
| *H05K 1/05* | (2006.01) | |
| *H05K 1/18* | (2006.01) | |
| *H05K 1/02* | (2006.01) | |
| *H05K 3/32* | (2006.01) | |
| *F21K 9/90* | (2016.01) | |
| *F21V 29/74* | (2015.01) | |
| *F21Y 115/10* | (2016.01) | |

(52) U.S. Cl.
CPC .............. *F21V 23/005* (2013.01); *F21K 9/90* (2013.01); *F21V 29/74* (2015.01); *H05K 1/0203* (2013.01); *H05K 1/05* (2013.01); *H05K 1/185* (2013.01); *H05K 3/32* (2013.01); *F21Y 2115/10* (2016.08); *H05B 33/0854* (2013.01); *H05B 37/0272* (2013.01); *H05K 2201/066* (2013.01); *H05K 2201/10106* (2013.01)

(58) Field of Classification Search
None
See application file for complete search history.

(56) References Cited

U.S. PATENT DOCUMENTS

2016/0330825 A1* 11/2016 Recker ............... H05B 37/0272
2017/0045214 A1* 2/2017 Johnson .................. F21V 3/061
2018/0074151 A1* 3/2018 McCanless ............... G01S 1/08

* cited by examiner

*Primary Examiner* — Jany Richardson
(74) *Attorney, Agent, or Firm* — Pierson IP, PLLC

(57) ABSTRACT

Examples of the present disclosure are related to systems and methods for lighting fixtures. More particularly, embodiments disclose directly embedded a smart module with a lighting fixture utilizing metal core PCB (MCPCB).

17 Claims, 4 Drawing Sheets

SYSTEMS AND METHODS FOR A SMART MODULE DIRECTLY EMBEDDED ON A LIGHTING FIXTURE

CROSS-REFERENCE TO RELATED APPLICATIONS

This application claims a benefit of priority under 35 U.S.C. § 119 to Provisional Application No. 62/516,412 filed on Jun. 7, 2017, which is fully incorporated herein by reference in their entirety.

BACKGROUND INFORMATION

Field of the Disclosure

Examples of the present disclosure are related to systems and methods for lighting fixtures. More particularly, embodiments disclose embedding a smart module on a light fixture, wherein the smart module includes a sensor and antenna.

Background

Lighting control systems are systems that incorporate communications between various systems inputs and outputs related for lighting controls. Conventionally, lighting control systems are used on both indoor and outdoor lighting of commercial, industrial, and residential spaces. Lighting control systems are generally used to provide the right amount of light when and where the light is needed.

Conventional lighting control systems are employed to maximize energy savings from the lighting systems, comply with conservations programs, and produce efficient harvest of plants. Conventionally, lighting control systems may operate using the temperature inside of a building and/or the photon levels of the lighting to implement a schedule. However, conventional systems do not allow a user to remotely receive data associated with multiple sensor readings within a customer's premise and/or remotely control and schedule the lighting within the customer premise.

Accordingly, needs exist for more effective and efficient systems and methods for light fixtures with a smart module directly integrated into MCPCB, wherein the MCPCB may be or may not be coupled to a heat sink.

SUMMARY

Examples of the present disclosure are related to systems and methods for lighting controls and sensors. Embodiments described herein may utilize a user interface and/or embedded systems with sensors using wireless transceivers to allow a user to set-up and control in real-time characteristics associated with light fixtures. In embodiments, the embedded systems may be directly embedded into metal core PCB (MCPCB) that is used as a superstructure, wherein the MCPCB may or may not be coupled with a heat sink. In embodiments, utilizing the MCPCB as a superstructure may limit costs and the amount of wiring necessary to position the light sources, circuitry, etc. associated with the light fixture.

Embodiments may include a MCPCB substrate, a plurality of light emitting diodes, and one or multiple sensor modules.

The substrate, such as a bent MCPCB sheet, may be directly populated with electronic components, such as LEDS, connectors, fuses, etc. The MCPCB sheet may then be coated for protection. The bent MCPCB panel can then be assembled into a light fixture and used with or without an additional heat sink. Electronic components such as embedded light sources, sensors, control circuitry may be directly embedded on the MCPCB may allow for lower material costs, lower labor costs, and superior thermal performance. Traces may be positioned directly on the MCPCB to connect the electronic components.

Labor costs may also be reduced by removing the steps of adhesive dispensing or tape dispensing, MCPCB placement process, and time to cure or set the adhesive or tape.

Groupings of LEDs may be positioned on MCPCB panel, which may extend along the longitudinal axis of the MCPCB panel. The LED groupings may be symmetrically or asymmetrically spaced from the central axis of the MCPCB panel.

The sensor module may include a sensor housing, a sensor, transceiver, and circuit board that are directly embedded on the MCPCB between groupings of LEDs. By directly embedding the sensor module on the MCPCB, wiring associated with the superstructure can be removed, while condensing the positioning of electrical components of the light fixture, which enables the electrical components to be protected via the sensor housing. Furthermore, by positioning the sensor module between groupings of LEDs, sensors (such as a camera) may be able to collect and determine data directly on an area of interest that is affected by the LEDs, wherein this direct data may be utilized to provide feedback to control the LEDs.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
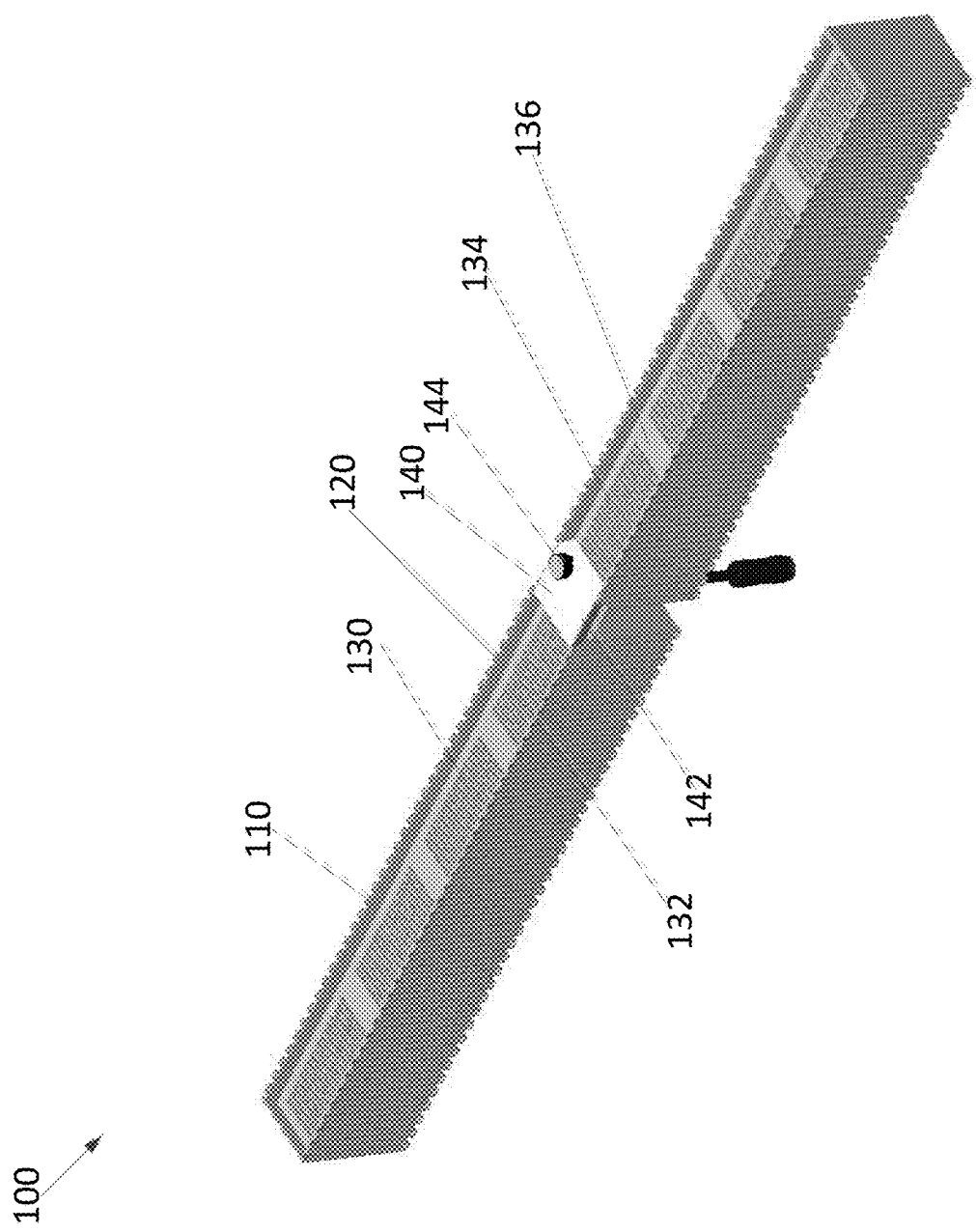
FIG. 1 depicts a light fixture system with a smart module, according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

FIG. 1 depicts a light fixture system 100 with a smart module 140, according to an embodiment. System 100 may include a heat sink 110, MCPCB 120, light sources 130, and smart module 140.

Heat sink 110 may be comprised of a unitary, folded sheet of metal, such as aluminum. The sheet of metal may be folded over itself from a first end of heat sink 110 to a second end of heat sink 110 to create fins. The fins may then be extruded to receive MCPCB 120, wherein MCPCB 120 may be embedded within a body of the folded and extruded heat sink 110. In other embodiments, heat sink 110 may be formed by creating fins by extruding a unitary block of metal, such as aluminum. The extrusions consist of fins extending from an upper surface of the unitary block of metal towards or to base, wherein the extrusions may be formed by inserting the unitary block of metal through a die that include fin portions. Remaining portions of the unitary block of metal may form the fins via the negative of the die. In further embodiments, the heat sink 110 may be any type of heat sink with a chamber configured to receive MCPCB 120. However, other embodiments may not include a heat sink 110.

MCPCB 120 may be formed of any metal or plastics, including: silver, tin, gold, copper, 3003 AL, 5052 AL, and/or other desired metals. In specific implementations, MCPCB 120 may be formed of a metal or substrate with a very low emissivity. However such a system would be much larger than a system with a high emissivity platform. Furthermore, MCPCB 120 may be formed of any material that can directly populated or embedded with the electronic components of system 100, and be affixed and embedded within a heat sink, wherein the heat sink is formed of folded fins and/or extrusions.

Light sources 130 may be light emitting diodes (LEDs) or any other device that is configured to emit light. Light sources 130 may be directly embedded or positioned on MCPCB 120, such that additional operations to affix tape or thermal adhesives to MCPCB 120, a heat sink, or both are not required. Light sources 130 may be positioned from a first end of MCPCB 110 to a second end of MCPCB 120. Light sources 130 may be configured to generate heat in response to creating and emitting light. Light sources 130 may be arranged on MCPCB 120 in a plurality of rows, or in any predetermined layout to generate a desired light pattern on an area of interest positioned below system 100. In embodiments, light sources 130 may be positioned in a plurality of sub sectioned groupings 132, 134, which may be separated by a space 136. In embodiments, each grouping 132, 134 of light sources 130 may be directly positioned on MCPCB 120 to form a substructure, wherein the light sources 130 are coupled by traces positioned on the MCPCB 120. As such, light sources 130 may utilize the electrical characteristics of MCPCB 120 to form a superstructure that limits the number of electrical interconnects of system 100.

Smart module 140 may be a device with a housing 142 and sensor 144 that is positioned within a space 136 between groupings of light sources 130 and between the bends of the MCPCB 120.

Housing 142 may be a casing that extends from a distal edge of a first bend of MCPCB 120 to a distal edge of a second bend of MCPCB 120, and also includes sidewalls extending to a flat surface between the bends. Housing 142 may be configured to protect the circuitry of sensor 144 from the elements, environment, and heat generated from light sources 130. In embodiments, housing 142 may be a plastic or metal cover.

Sensor 144 and the corresponding circuitry may be configured to be positioned within housing 142. Sensor 144 may include a power supply, antenna, controller, and sensors, such as a CO2 sensor, temperature sensor, humidity sensor, Photosynthetic Photon Flux sensor, radiometer, visible camera, spectrometer, fluorimeter, pyrometer, bolometer, etc. By positioning sensor 144 directly on MCPCB 120 between groupings of light sources 130, sensor 144 may be able to determine data directly impacted by light sources 130. Furthermore, by utilizing the characteristics of MCPCB 120 to form a superstructure with sensor 144, the number of electrical interconnects of system 100 may be reduced.

Furthermore, by positioning sensors 144 directly onto MCPCB 120 between light sources 130, sensors 144 may be able to determine data associated with light fixture 100 directly at a point of the emitted light and/or directly monitor an area of interest impacted by the emitted light. For example, in embodiments, wherein sensors 144 include a camera, the camera may be able to determine data, images, recordings, etc. directly of the area of interest below the light sources 130. This may allow an operator to remotely change characteristics of light sources 130, such as intensity, interval duration, operating times, etc. based on the observed area of interest.

Additional embodiments of the smart module may include a circuit board that is configured to be coupled to the light sources 130 and the transceiver associated with the smart module 140. The circuit board may be directly embedded on the MCPCB 120 as a superstructure, and may be coupled with the other elements of smart module 140 via traces that are also directly embedded on MCPCB 120. The circuit board may be configured to receive data from a remote computing device via the transceiver, and communicate data associated with the received data to control light sources 130. For example, the circuit board may receive data from the remote computing device to dim light sources 130, modify a duty cycles associated with light sources 130, and locally control light sources 130 based on the data.

Figure 2:
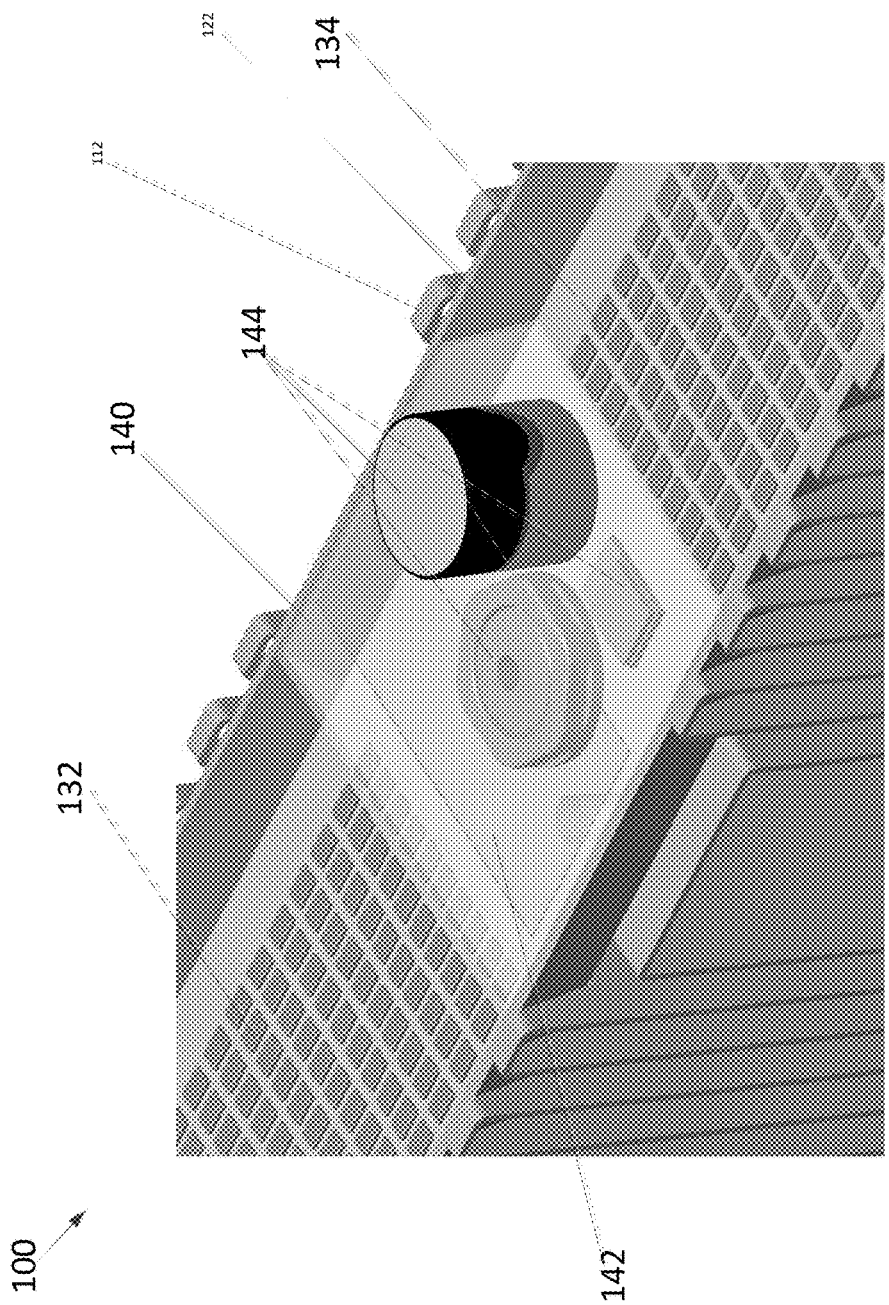
FIG. 2 depicts a light fixture system with a smart module, according to an embodiment.

FIG. 2 depicts a light fixture system 100 with a smart module 140, according to an embodiment. Elements depicted in FIG. 2 may be described above, and for the sake of brevity an additional description of these elements is omitted.

As depicted in FIG. 2, sensor module 140 may include a plurality of sensors 144, which may include traces that are directly positioned on MCPCB 120 to electrically connect the sensor 144. In embodiments, the traces may be positioned within the portions of MCPCB 120 that are covered by housing 142 to limit the amount of exposed traces, and limit the amount of traces of system 100.

As further depicted in FIG. 2, the distal ends of the bends 122 of MCPCB 120 may be positioned below the distal ends of fins 112 of the heat sink 110. This positioning may be utilized to further shield the components within sensor module 140 from the elements.

Figure 3:
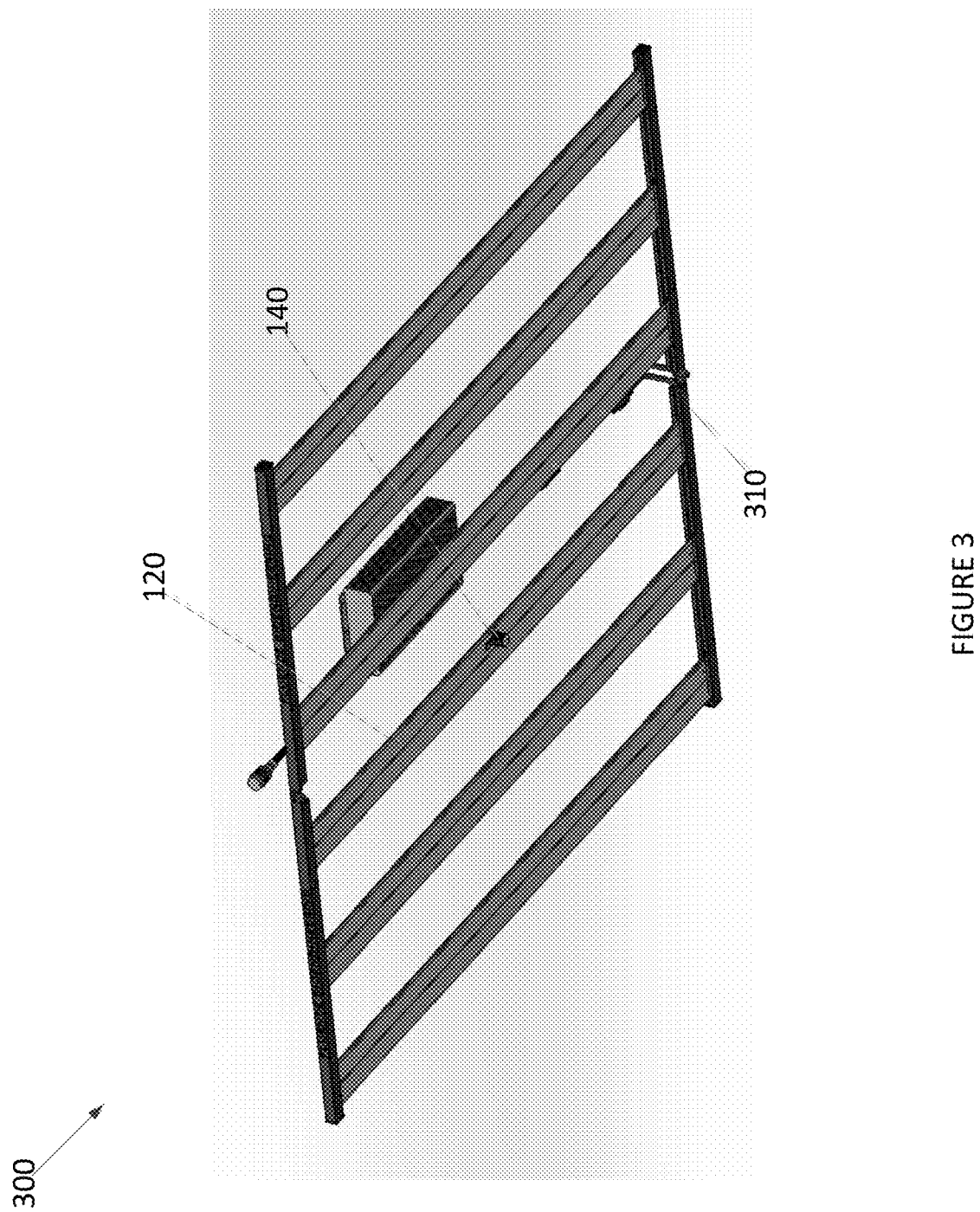
FIGS. 3 and 4 depict a light fixture system with a smart module, according to an embodiment.
Figure 4:
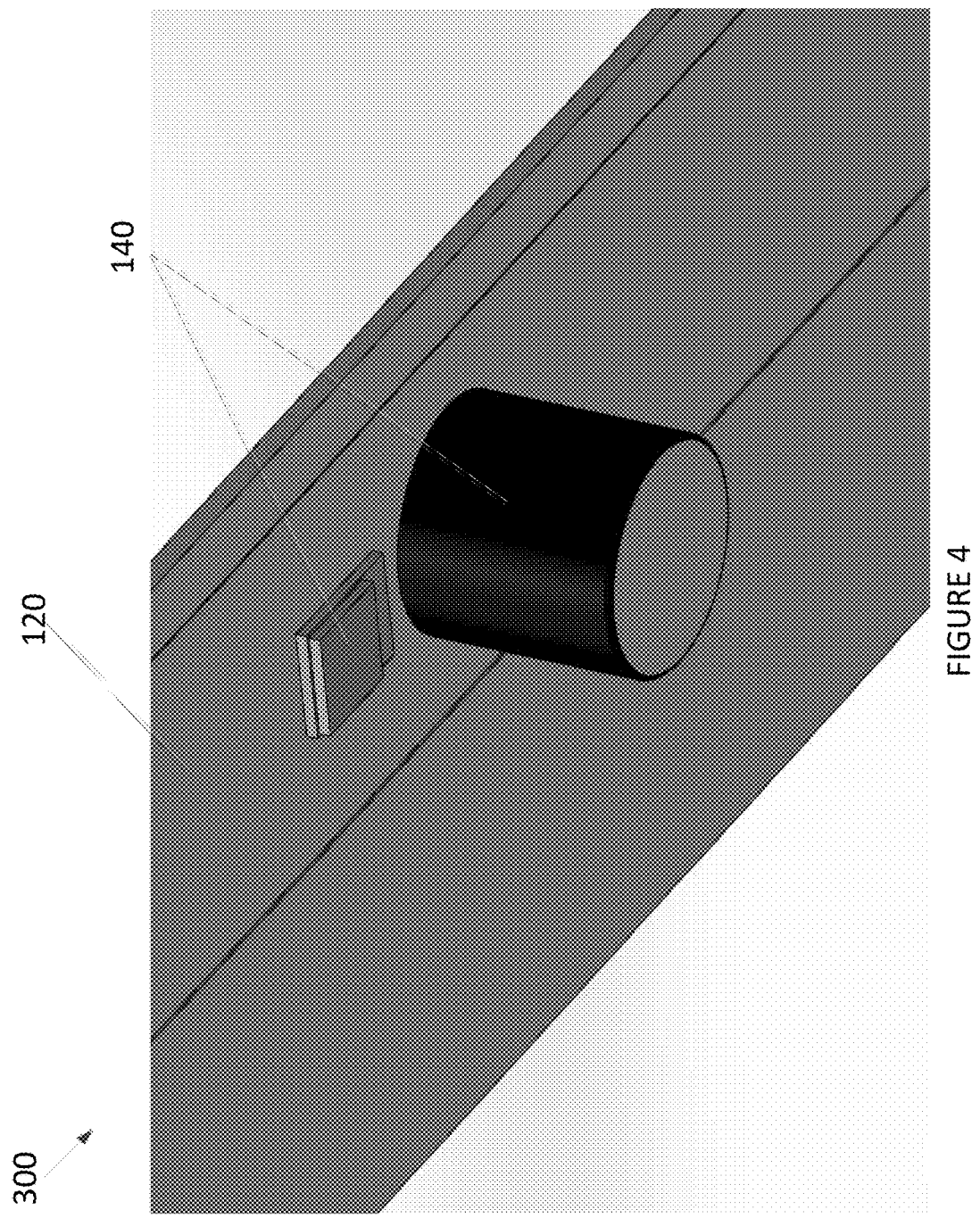

FIGS. 3 and 4 depict a light fixture system 300 with a smart module 140, according to an embodiment. Elements depicted in FIG. 3 may be described above, and for the sake of brevity an additional description of these elements is omitted.

As depicted in FIGS. 3 and 4, a smart module 140 may be configured to be directly positioned on a MCPCB 120, without a heat sink 110. This may limit the number of components that is required to have a light fixture system 300 with a smart module 140. Smart module 140 may be formed as a superstructure directly embedded on MCPCB 120 with traces coupled to the light fixture's wiring 310.

More specifically, sensors 144 associated with smart module 140 may be a BLE or other type of antenna and a COZIR sensor that are directly embedded on the MCPCB.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

The flowcharts and block diagrams in the flow diagrams illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

What is claimed is:

1. A light fixture comprising:
   a substrate formed of metal core PCB;
   a first grouping of light sources embedded on the substrate;
   a second grouping of light sources embedded on the substrate, wherein there is a space between the first grouping of light sources and the second grouping of light sources;
   a smart module including at least one sensor being embedded on the substrate within the space, wherein traces associated with the smart module are directly embedded on the substrate, the traces being configured to electrically couple the first grouping of light sources, the second grouping of light sources, and electronic components associated with the smart module.

2. The light fixture of claim 1, further comprising:
   a heat sink attached to the substrate, wherein the heat sink is formed of a folded fin or extrusions.

3. The light fixture of claim 1, wherein the smart module includes a camera, wherein the camera is configured to capture images of an area of interest positioned directly under the substrate.

4. The light fixture of claim 1, wherein the substrate is coupled with a heat sink.

5. The light fixture of claim 1, wherein the smart modules includes at least one antenna configured to transmit data associated with the at least one sensor.

6. The light fixture of claim 1, wherein the at least one antenna is embedded within the substrate.

7. A light fixture comprising:
   a substrate formed of metal core PCB;
   a first grouping of light sources embedded on the substrate;
   a second grouping of light sources embedded on the substrate, wherein there is a space between the first grouping of light sources and the second grouping of light sources;
   a smart module including at least one sensor being embedded on the substrate within the space, wherein the smart module includes a housing configured to cover the smart module, wherein the substrate includes a first bend, a second bend, and a planer surface extending between a proximal end of the first bend and a proximal end of the second bend, and the housing extends from a distal end of the first bend to a distal end of the second bend.

8. The light fixture of claim 7, wherein the housing is comprised of plastic or metal.

9. A method of forming a light fixture comprising:
   embedding a first grouping of light sources on a substrate formed of metal core PCB;
   embedding a second grouping of light sources the substrate, wherein there is a space between the first grouping of light sources and the second grouping of light sources;
   embedding a smart module including at least one sensor on the substrate within the space;
   electrically coupling the smart module with the first grouping of light sources and the second grouping of light sources via traces that are directly embedded on the substrate.

10. The method of claim 9, wherein the smart module includes a housing configured to cover the smart module.

11. The method of claim 10, wherein the substrate includes a first bend, a second bend, and a planer surface extending between a proximal end of the first bend and a proximal end of the second bend, and the housing extends from a distal end of the first bend to a distal end of the second bend.

12. The method of claim 10, wherein the housing is comprised of plastic or metal.

13. The method of claim 9, further comprising:
   attaching a heat sink to the substrate, wherein the heat sink is formed of a folded fin or extrusions.

14. The method of claim 9, wherein the smart module includes a camera, wherein the camera is configured to capture images of an area of interest positioned directly under the substrate.

15. The method of claim 9, wherein the substrate is coupled with a heat sink.

16. The method of claim 9, wherein the smart modules includes at least one antenna configured to transmit data associated with the at least one sensor.

17. The method of claim 9, wherein the at least one antenna is embedded within the substrate.

\* \* \* \* \*